United States Patent
Zhang et al.

(10) Patent No.: US 11,509,882 B2
(45) Date of Patent: Nov. 22, 2022

(54) THREE-DIMENSIONAL DISPLAY APPARATUS AND VIRTUAL REALITY DEVICE

(71) Applicants: Beijing BOE Optoelectronics Technology Co., Ltd., Beijing (CN); BOE Technology Group Co., Ltd., Beijing (CN)

(72) Inventors: Shuo Zhang, Beijing (CN); Hao Zhang, Beijing (CN); Lili Chen, Beijing (CN); Minglei Chu, Beijing (CN); Hongzhen Xue, Beijing (CN); Guixin Yan, Beijing (CN); Zehua Dong, Beijing (CN); Huidong He, Beijing (CN); Chenxi Zhao, Beijing (CN); Xiangjun Peng, Beijing (CN); Yaoyu Lv, Beijing (CN); Yukun Sun, Beijing (CN); Qingwen Fan, Beijing (CN); Yachong Xue, Beijing (CN)

(73) Assignees: BEIJING BOE OPTOELECTRONICS TECHNOLOGY CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 193 days.

(21) Appl. No.: 16/772,902

(22) PCT Filed: Aug. 26, 2019

(86) PCT No.: PCT/CN2019/102570
§ 371 (c)(1),
(2) Date: Jun. 15, 2020

(87) PCT Pub. No.: WO2021/035473
PCT Pub. Date: Mar. 4, 2021

(65) Prior Publication Data
US 2022/0132098 A1 Apr. 28, 2022

(51) Int. Cl.
*H04N 13/315* (2018.01)
*H01L 27/32* (2006.01)

(52) U.S. Cl.
CPC ....... *H04N 13/315* (2018.05); *H01L 27/3232* (2013.01)

(58) Field of Classification Search
CPC .................................................. H04N 19/52
USPC ..................................................... 375/240.12
See application file for complete search history.

(56) References Cited

U.S. PATENT DOCUMENTS

| | | | |
|---|---|---|---|
| 2006/0092379 A1 | 5/2006 | Cho et al. | |
| 2007/0139760 A1 | 6/2007 | Baker et al. | |
| 2010/0177113 A1 | 7/2010 | Gay et al. | |
| 2010/0225985 A1* | 9/2010 | Fukumoto | G11B 20/10009 359/32 |

(Continued)

FOREIGN PATENT DOCUMENTS

| CN | 1922530 A | 2/2007 |
|---|---|---|
| CN | 101681023 A | 3/2010 |

(Continued)

OTHER PUBLICATIONS

International search report of PCT application No. PCT/CN2019/102570 dated May 15, 2020.

(Continued)

*Primary Examiner* — Yulin Sun
(74) *Attorney, Agent, or Firm* — Fay Sharpe LLP (57) ABSTRACT

A three-dimensional display apparatus includes: a display layer and a transmissive phase modulator, wherein the transmissive phase modulator is disposed on a light exit side of the display layer, and includes a plurality of modulation units; and each of the modulation units is configured to perform phase modulation on light received by the modulation unit, and is configured such that a picture displayed by the display layer is presented as a contiguous curved virtual image after being processed by the transmissive phase modulator.

14 Claims, 7 Drawing Sheets

(56) References Cited

U.S. PATENT DOCUMENTS

| | | | |
|---|---|---|---|
| 2013/0120817 A1 | 5/2013 | Yoon et al. | |
| 2016/0227085 A1 | 8/2016 | Xu et al. | |
| 2018/0224695 A1* | 8/2018 | Zhang | G02B 3/0062 |
| 2018/0231812 A1 | 8/2018 | Tan et al. | |
| 2018/0372924 A1 | 12/2018 | Gao et al. | |
| 2020/0068191 A1 | 2/2020 | Yu et al. | |
| 2020/0201065 A1* | 6/2020 | Zhang | G02B 30/24 |
| 2020/0233214 A1* | 7/2020 | Jia | G02B 27/44 |

FOREIGN PATENT DOCUMENTS

| | | | |
|---|---|---|---|
| CN | 103116228 A | 5/2013 | |
| CN | 105954883 A | 9/2016 | |
| CN | 106125394 A | 11/2016 | |
| CN | 106873169 A | 6/2017 | |
| CN | 107357047 A | 11/2017 | |
| CN | 107884940 A | 4/2018 | |
| CN | 104580869 B | 6/2018 | |
| CN | 208044203 U | 11/2018 | |
| CN | 105894970 B | 2/2019 | |
| CN | 109507807 A | 3/2019 | |
| CN | 109742256 A | 5/2019 | |

OTHER PUBLICATIONS

China National Intellectual Property Administration, First office action of Chinese application No. 201980001471.5 dated Jun. 1, 2022, which is foreign counterpart application of this US application.

* cited by examiner

THREE-DIMENSIONAL DISPLAY APPARATUS AND VIRTUAL REALITY DEVICE

The present application is a 371 of PCT Application No. PCT/CN2019/102570, filed on Aug. 26, 2019, the content of which is incorporated herein by reference.

TECHNICAL FIELD

The present disclosure relates to the field of display technologies, and more particularly to a three-dimensional display apparatus and a virtual reality device.

BACKGROUND

Virtual reality (VR) is a hot technology in the field of display in recent years. Focal plane display is a three-dimensional (3D) display technology developed for the VR.

SUMMARY

Embodiments of the present disclosure provide a three-dimensional display apparatus and a virtual reality device, and provide a novel three-dimensional stereoscopic display structure based on focal plane display. The technical solutions are as follows.

At least one embodiment of the present disclosure provides a three-dimensional display apparatus. The apparatus includes:

a display layer and a transmissive phase modulator; wherein the transmissive phase modulator is disposed on a light exit side of the display layer; and the transmissive phase modulator includes a plurality of modulation units, wherein each of the modulation units is configured to perform phase modulation on light received by the modulation unit, and is configured such that a picture displayed by the display layer is presented as a contiguous curved virtual image after being processed by the transmissive phase modulator.

Exemplarily, the transmissive phase modulator includes two first electrode layers opposite to each other, and a first liquid crystal layer disposed between the two first electrode layers.

Exemplarily, the transmissive phase modulator further includes first alignment films disposed on both sides of the first liquid crystal layer respectively, and directions of initial long axes of liquid crystal molecules in the first liquid crystal layer are the same.

Exemplarily, at least one of the two first electrode layers of the transmissive phase modulator includes a plurality of electrode blocks distributed in an array, wherein each of the electrode blocks corresponds to a modulation unit.

Optionally, the three-dimensional display apparatus further includes an optical path adjustment liquid crystal cell disposed between the display layer and the transmissive phase modulator; wherein the optical path adjustment liquid crystal cell includes two second electrode layers opposite to each other, and a second liquid crystal layer disposed between the two second electrode layers; and the optical path adjustment liquid crystal cell further includes second alignment films disposed on both sides of the second liquid crystal layer respectively, and directions of initial long axes of liquid crystal molecules in the second liquid crystal layer are the same.

Exemplarily, the display layer is an OLED display layer; and the three-dimensional display apparatus further includes: a linear polarizer disposed on the light exit side of the display layer, wherein a polarization direction of light emitted from the OLED display layer after passing through the linear polarizer is the same as the initial long axis direction of the liquid crystal molecules in the transmissive phase modulator.

Exemplarily, the display layer is an LCD display layer; and the LCD display layer includes a display substrate, and a linear polarizer disposed on a light exit side of the display substrate, and a polarization direction of light emitted from the LCD display layer is the same as the initial long axis direction of the liquid crystal molecules in the transmissive phase modulator.

Exemplarily, the display layer includes a plurality of pixels, and each of the modulation units corresponds to a fixed number of pixels in the plurality of pixels.

At least one embodiment of the present disclosure provides a virtual reality device. The device includes:

the three-dimensional display apparatus as described above; and an eyepiece corresponding to a light exit side of a transmissive phase modulator in the three-dimensional display apparatus.

Optionally, the virtual reality device further includes:

a control apparatus, configured to acquire a 3D picture to be displayed, control a display layer in the three-dimensional display apparatus to display on the basis of the 3D picture to be displayed, and control each of modulation units of the transmissive phase modulator to perform phase modulation on light received by the modulation unit.

Optionally, the control apparatus is configured to identify a voltage corresponding to each of the modulation units of the transmissive phase modulator on the basis of the 3D picture to be displayed; and control each of the modulation units of the transmissive phase modulator to operate by adopting the voltage corresponding to the modulation unit.

Optionally, the control apparatus is configured to identify coordinates of a pixel of the 3D picture corresponding to each of the modulation units on the basis of the 3D picture to be displayed; and identify a voltage corresponding to each modulation unit on the basis of the coordinates of the pixel of the 3D picture corresponding to the modulation unit.

DETAILED DESCRIPTION

For clearer descriptions of the objectives, technical solutions and advantages in the present disclosure, the present disclosure is described in detail below in combination with the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

Figure 1:
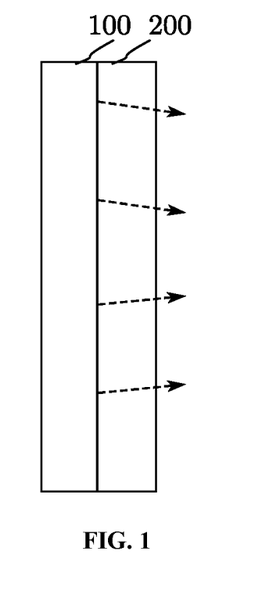
FIG. 1 is a schematic structural diagram of a three-dimensional display apparatus according to an embodiment of the present disclosure.

FIG. 1 is a schematic structural diagram of a three-dimensional display apparatus according to an embodiment of the present disclosure. Referring to FIG. 1, the three-dimensional display apparatus includes: a display layer 100 and a transmissive phase modulator 200. The transmissive phase modulator 200 is disposed on a light exit side of the display layer 100.

Here, the transmissive phase modulator 200, namely, a spatial light modulator, is configured to change a phase of light, such that angles of the light emitted from different positions of the display layer 100 may be different (as shown in FIG. 1) to change a planar image into a curved image having a scene depth.

Figure 2:
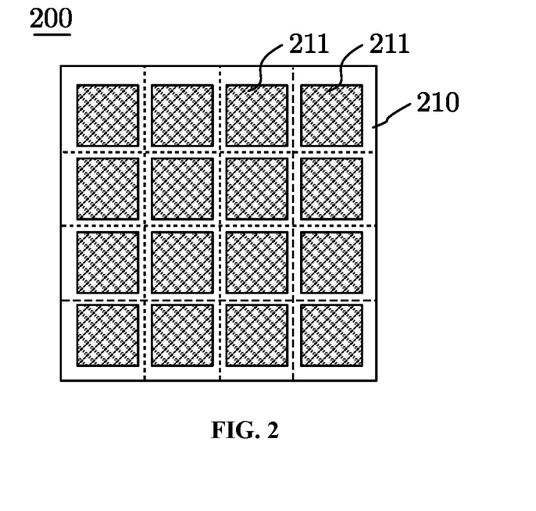
FIG. 2 is a top view of a transmissive phase modulator according to an embodiment of the present disclosure.

FIG. 2 is a top view of a transmissive phase modulator according to an embodiment of the present disclosure. Referring to FIG. 2, the transmissive phase modulator 200 includes a plurality of modulation units 210. Each of the modulation units 210 is configured to perform phase modulation on light received by the modulation unit 210, and is configured such that a picture displayed by the display layer 100 is presented as a contiguous curved virtual image after being processed by the transmissive phase modulator 200.

In the embodiment of the present disclosure, a light source emitted from the display layer 100 is a plane wave, and is modulated by the plurality of modulation units 210 when traveling through the transmissive phase modulator 200. Since each modulation unit 210 is capable of performing phase modulation on light received by the modulation unit 210, such that the angles of the light modulated by the different modulation units 210 are different. Thus, the planar image is changed into the curved virtual image having the scene depth. In this way, after the light travels through an eyepiece, the image seen by human eyes embodies depth information, thereby achieving 3D imaging. As the transmissive phase modulator is arranged on a light exit surface of the display layer, a thickness of the transmissive phase modulator is smaller. When the three-dimensional display apparatus is applied to the VR device, a distance between the eyepiece and the display layer may be designed to be shorter, such that a larger angle of view may be obtained. Meanwhile, because the distance between the eyepiece and the display layer may be designed to be shorter, a size of the entire VR device may be designed to be smaller accordingly.

Figure 3:
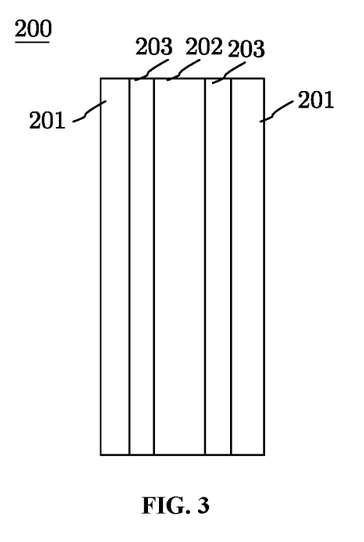
FIG. 3 is a schematic structural diagram of a transmissive phase modulator according to an embodiment of the present disclosure.

FIG. 3 is a schematic structural diagram of a transmissive phase modulator according to an embodiment of the present disclosure. Referring to FIG. 3, the transmissive phase modulator 200 includes two first electrode layers 201 opposite to each other, and a first liquid crystal layer 202 disposed between the two first electrode layers 201.

In this implementation, phase modulation of light is achieved by controlling deflection of liquid crystal molecules. Specifically, deflection angles of the liquid crystal molecules are different, and phase differences between O light and E light are different when the light is refracted by the liquid crystal molecules of the different modulation units, thereby achieving the phase modulation of the light. Each modulation unit is equivalent to a lens, and a focal length of the lens may be controlled by controlling the deflection angle of the liquid crystal molecule.

As shown in FIG. 3, the transmissive phase modulator 200 further includes first alignment films 203 disposed on both sides of the first liquid crystal layer 202 respectively.

Figure 4:
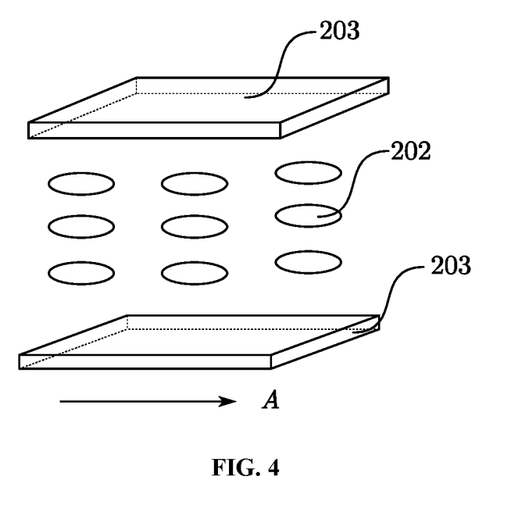
FIGS. 4 and 5 are schematic structural diagrams of a liquid crystal layer according to an embodiment of the present disclosure.
Figure 5:
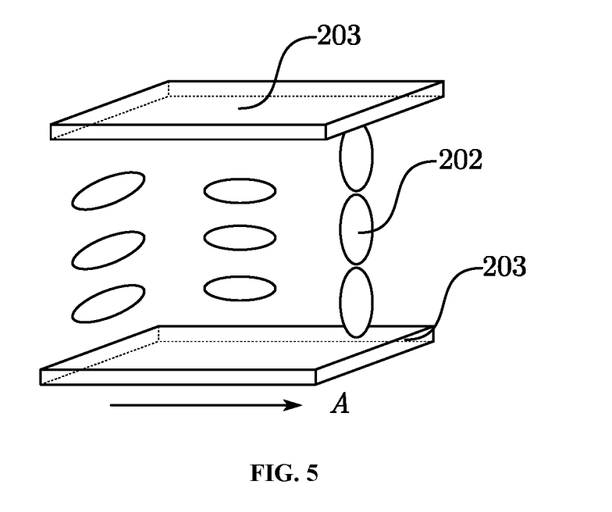

FIGS. 4 and 5 are schematic structural diagrams of a liquid crystal layer according to an embodiment of the present disclosure. Referring to FIG. 4, directions of initial long axes of the liquid crystal molecules in the first liquid crystal layer 202 are the same. That is, the directions are the same in an unpowered state.

In the embodiment of the present disclosure, the first alignment film 203 is intended to align liquid crystal molecules during a manufacturing process. When the two first alignment films are in rubbing alignment, alignment directions are the same, and for example, both in a direction A shown in the figure, such that the directions of the initial long axes of the liquid crystal molecules are the same. When electrodes are powered on, the long axes of the liquid crystal molecules may rotate in a plane perpendicular to the first alignment films and parallel to the direction A, as shown in FIG. 5.

In a possible implementation, at least one of the two first electrode layers 201 of the transmissive phase modulator 200 includes a plurality of electrode blocks. As shown in FIG. 2, the plurality of electrode blocks 211 are distributed in an array, and each electrode block 211 corresponds to a modulation unit 210 to control the deflection of the liquid crystal molecules in the modulation unit 210.

Here, the liquid crystal layers of each modulation unit 210 of the transmissive phase modulator 200 are integrated. The only difference is that the electrode blocks 211 are independent of each other. The shape and the size of the electrode block 211 in FIG. 2 are only schematic and do not limit the electrode block.

For independent control of each electrode block 211, the electrode block 211 may be connected to a drive device through an electrode wire, and is supplied with a voltage by the drive device.

Exemplarily, if the first electrode layer 201 is a surface electrode, the first electrode layer 201 may be a transparent indium tin oxide (ITO) electrode layer. In this way, both conductive performance and light transmission performance are ensured. If the first electrode layer 201 is an electrode block, a metal electrode may be adopted. The surface of the metal electrode may be designed to be smaller as long as an aperture ratio of the modulation unit 210 is ensured.

Figure 6:
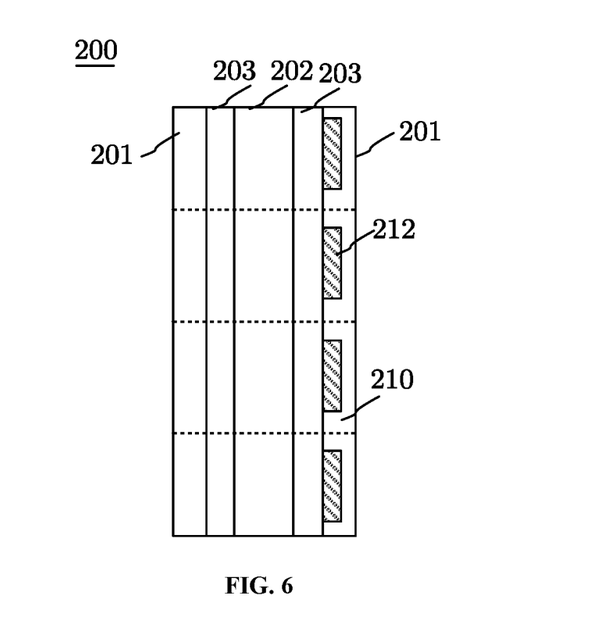
FIG. 6 is a schematic structural diagram of another transmissive phase modulator according to an embodiment of the present disclosure.

FIG. 6 is a schematic structural diagram of another transmissive phase modulator according to an embodiment of the present disclosure. Referring to FIG. 6, the transmissive phase modulator is different from the transmissive phase modulator provided in FIG. 3 in that each modulation unit 210 has a control switch 212 which may be a thin film transistor (TFT); and in each TFT, a grid electrode is connected to a grid line, a source electrode is connected to a data line, and a drain electrode is connected to the electrode block. Each row of the modulation units 210 corresponds to one grid line, and each column of the modulation units 210 corresponds to one data line. The grid line and the data line form a region corresponding to the modulation unit 210 in a surrounding fashion, and the TFT is arranged in the region. The grid line controls turn-on and turn-off of the TFT, and a voltage signal is written to the electrode block 211 corresponding to the TFT by the data line.

Figure 7:
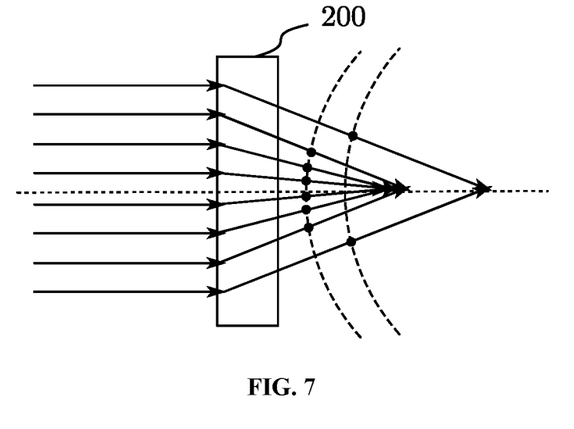
FIG. 7 is a schematic diagram of modulation according to an embodiment of the present disclosure.

During operating, each row of the modulation units 210 is controlled to operate in sequence by the grid line; and then, a voltage signal corresponding to the modulation unit is written to control the deflection of the liquid crystal molecules of the modulation unit 210, thereby controlling the focal length of the modulation unit 210, and controlling a phase difference of light modulated by the modulation units 210 to realize modulation of the light emitted from the display layer. FIG. 7 is a schematic diagram of modulation according to an embodiment of the present disclosure. Referring to FIG. 7, the focal length of each modulation unit 210 (the black dot in FIG. 7) is controlled by controlling the liquid crystal molecule deflection of the different modulation units 210 in the transmissive phase modulator.

Light having different phase differences may be modulated by the modulation units 210 with different focal lengths. The relationship between the focal length and the phase difference is as follows:

$$\phi(x, y) = -\frac{\pi}{\lambda f(x, y)}(x^2 + y^2);$$

wherein $\phi(x,y)$ is a phase difference of light modulated by the modulation unit 210 with coordinates (x,y) in the transmissive phase modulator 200, and f(x,y) is a focal length of the modulation unit 210 with the coordinates (x,y); and in the transmissive phase modulator 200, coordinates of the modulation unit 210 at the center may be (0, 0), and then coordinates are assigned to other modulation units 210 according to an xy coordinate system. $\lambda$ is a wavelength of light. In the present disclosure, no distinction is present between light of different colors in the phase modulation. For example, green light wavelength may be used for calculation in each calculation.

The phase difference corresponds to the deflection of the liquid crystal molecules; the deflection of the liquid crystal molecules corresponds to a voltage applied to the electrode block; and the focal length of the modulation unit corresponds to three-dimensional coordinates of an image. Therefore, based on the above corresponding relationships, a corresponding relationship between the three-dimensional coordinates of the image and the voltages of the electrode blocks may be obtained. This relationship may be stored in the driving apparatus, and is used when the three-dimensional display apparatus operates.

In an implementation of an embodiment of the present disclosure, the display layer 100 may be an organic light emitting diode (OLED) display layer. When the display layer 100 is the OLED display layer, the three-dimensional display apparatus further includes: a linear polarizer (not shown in the figure) disposed on the light exit side of the display layer 100. A polarization direction of the light emitted from the OLED display layer after traveling through the linear polarizer is the same as an initial long axis direction of the liquid crystal molecules in the transmissive phase modulator 200.

As the light generated by the OLED display layer is circularly-polarized light, and the liquid crystal molecules can only perform phase modulation on the light whose polarization direction is consistent with the long-axis direction, but not on polarized light whose polarization direction is perpendicular to the long axis direction, it is necessary to arrange the linear polarizer on the light exit side of the display layer 100 before the phase modulation is performed by the liquid crystal molecules of the transmissive phase modulator.

In another implementation of the embodiment of the present disclosure, the display layer 100 is a liquid crystal display (LCD) display layer. The LCD display layer includes a display substrate, and a linear polarizer disposed on a light exit side of the display substrate. A polarization direction of light emitted from the LCD display layer is the same as the initial long axis direction of the liquid crystal molecules in the transmissive phase modulator 200.

The LCD display layer itself has a linear polarizer which generates linearly polarized light. Thus, the light generated by the LCD display layer may be phase-modulated by the liquid crystal molecules in the transmissive phase modulator.

In the embodiment of the present disclosure, the rubbing alignment direction of the first alignment film 203 in the aforementioned transmissive phase modulator 200 is the same as the polarization direction of the aforementioned linear polarizer. That is, the rubbing alignment direction of the first alignment film 203 is the same as the polarization direction of light incident on the transmissive phase modulator 200, thereby ensuring that light emitted from the display layer can be modulated by the transmissive phase modulator 200.

Figure 8:
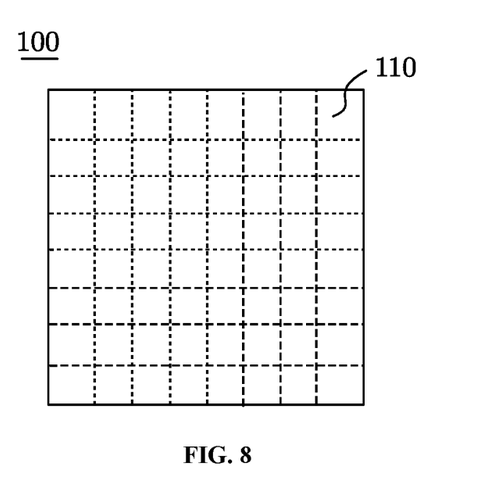
FIG. 8 is a top view of a display layer according to an embodiment of the present disclosure.

FIG. 8 is a top view of a display layer according to an embodiment of the present disclosure. Referring to FIG. 8, the display layer 100 includes a plurality of pixels 110; and each modulation unit 210 corresponds to a fixed number of pixels 110 among the plurality of pixels 110. A corresponding relationship is established between the modulation unit and the pixels, facilitating the control of phase modulation amplitude of the modulation unit. For example, by controlling the modulation unit, the deflection of the liquid crystal molecules in the modulation unit may be controlled based on a scene depth (i.e., three-dimensional coordinates) of an image to be displayed by the pixels corresponding to the modulation unit, so as to ensure that the modulation of light meets a scene depth requirement of the image.

Exemplarily, the pixels 110 of the display layer 100 correspond to the modulation units 210 of the transmissive phase modulator 200 one by one, such that the modulation accuracy of the scene depth of the 3D image can be ensured by the maximum length.

Exemplarily, the pixels 110 of the display layer 100 may not correspond to the modulation units 210 of the transmissive phase modulator 200 one by one. For example, the plurality of pixels 110 of the display layer 100 corresponds to one modulation unit 210 of the transmissive phase modulator 200. In this design, an accuracy requirement on the transmissive phase modulator 200 is lower, such that design, manufacture, and driving control are facilitated.

In the embodiment of the present disclosure, the display layer 100 and the transmissive phase modulator 200 may be integrated together. For example, the display layer 100 and the transmissive phase modulator 200 may be manufactured together. For example, the display layer is manufactured first, and then, the transmissive phase modulator 200 is manufactured on the display layer. Alternatively, the display layer 100 and the transmissive phase modulator 200 are manufactured separately first, and then are bonded together.

Figure 9:
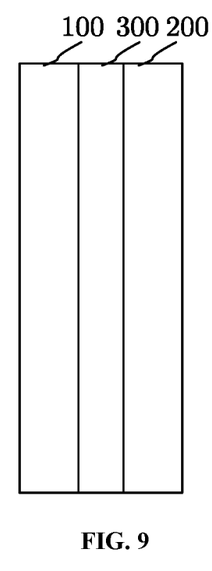
FIG. 9 is a schematic structural diagram of another three-dimensional display apparatus according to an embodiment of the present disclosure.

FIG. 9 is a schematic structural diagram of another three-dimensional display apparatus according to an embodiment of the present disclosure. Referring to FIG. 9, the three-dimensional display apparatus further includes an optical path adjustment liquid crystal cell 300 disposed between the display layer 100 and the transmissive phase modulator 200.

The optical path adjustment liquid crystal cell 300 is arranged between the display layer 100 and the transmissive phase modulator 200, and can lengthen a distance between the display layer 100 and the transmissive phase modulator 200 to a certain extent, such that an object distance required for imaging is lengthened, and a depth range of focal plane imaging (in a direction perpendicular to the display layer) is widened.

Meanwhile, the optical path adjustment liquid crystal cell 300 can adjust an optical path of light passing through the optical path adjustment liquid crystal cell 300, thereby adjusting the object distance without changing the distance between the display layer 100 and the transmissive phase modulator 200, and adjusting the depth range of the focal plane imaging.

Figure 10:
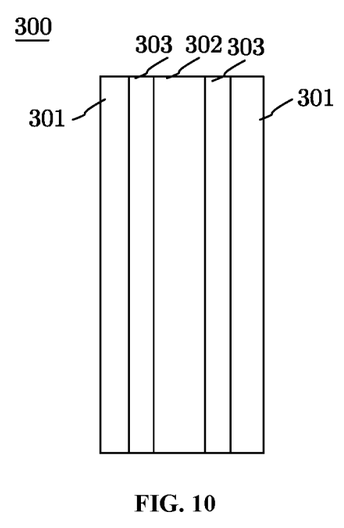
FIG. 10 is a schematic structural diagram of an optical path adjustment liquid crystal cell according to an embodiment of the present disclosure.

FIG. 10 is a schematic structural diagram of an optical path adjustment liquid crystal cell according to an embodiment of the present disclosure. Referring to FIG. 10, the optical path adjustment liquid crystal cell 300 includes two second electrode layers 301 opposite to each other, and a second liquid crystal layer 302 disposed between the two second electrode layers 301. In this implementation, a refractive index is controlled by controlling the deflection of the liquid crystal molecules.

As shown in FIG. 10, the optical path adjustment liquid crystal cell 300 further includes second alignment films 303 disposed on both sides of the liquid crystal layer 302, respectively. The directions of initial long axes of the liquid crystal molecules of the second liquid crystal layers 302 are the same. That is, the directions are the same in an unpowered state.

In the embodiment of the present disclosure, a function of the second alignment film 303 is to align liquid crystal molecules during a manufacturing process. When the two alignment films are in rubbing alignment, alignment directions are the same, such that the directions of the initial long axes of the liquid crystal molecules are the same. When electrodes are powered on, the long axes of the liquid crystal molecules may rotate in a plane perpendicular to the second alignment films and parallel to the alignment direction.

In this implementation, an alignment process is implemented through the second alignment films, such that the liquid crystal molecules are aligned, thereby ensuring that the liquid crystal molecules have the same direction.

In the embodiment of the present disclosure, the optical path adjustment liquid crystal cell 300 is intended to adjust the optical path, and there is no need to perform differential treatment on light of different pixels on the display layer 100, such that the optical path adjustment liquid crystal cell 300 may adopt a pixel-free structure. That is, different positions on the optical path adjustment liquid crystal cell achieve the same effect on the change of the optical path.

Exemplarily, the two second electrode layers 301 in the optical path adjustment liquid crystal cell 300 are both surface electrodes, such that the liquid crystal molecules of the entire optical path adjustment liquid crystal cell can be deflected to the desired angle under the control of the two surface electrodes, achieving control of the optical path.

For example, the second electrode layer 301 may be an ITO electrode layer, which ensures both conductive performance and light transmission performance of the optical path adjustment liquid crystal cell.

When a scene depth range of the image required to be displayed is wider, the deflection direction of the liquid crystal molecules may be changed by changing the voltages applied to the electrodes on both sides of the optical path adjustment liquid crystal cell. When the deflection direction of the liquid crystal molecules changes, a refractive index of the optical path adjustment liquid crystal cell changes, and an optical path of the light traveling through the optical path adjustment liquid crystal cell changes accordingly, such that the size of the object distance for imaging changes. Exemplarily, a corresponding relationship between the scene depth ranges and the magnitude of the voltages loaded on both sides of the optical path adjustment liquid crystal cell may be identified in advance, such that when the three-dimensional display device operates, all that is needed is to acquire the scene depth range of the image and then load the corresponding voltage to the optical path adjustment liquid crystal cell.

In the embodiment of the present disclosure, the rubbing alignment direction of the second alignment film 303 in the aforementioned optical path adjustment liquid crystal cell 300 is the same as the polarization direction of the aforementioned linear polarizer. That is, the rubbing alignment direction of the second alignment film 303 is the same as the polarization direction of light incident on the optical path adjustment liquid crystal cell 300, thereby ensuring that the optical path can be adjusted by adjusting the liquid crystal deflection direction.

Figure 11:
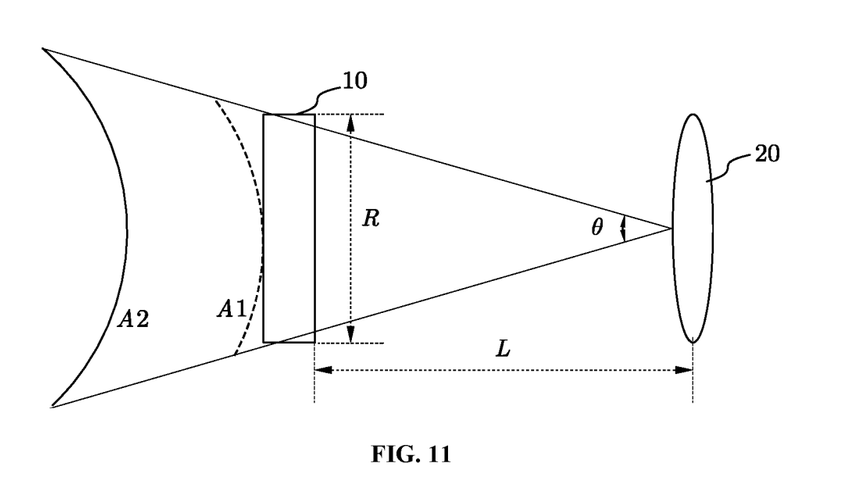
FIG. 11 is a schematic diagram of imaging of a three-dimensional display apparatus according to an embodiment of the present disclosure.

FIG. 11 is a schematic diagram of imaging of a three-dimensional display apparatus according to an embodiment of the present disclosure. Referring to FIG. 11, an operating principle of the three-dimensional display apparatus is based on a secondary imaging process: after the light travels through the phase modulator, the image presented on the display layer becomes an enlarged curved virtual image at the rear, which is called as an intermediate image A1. After the light travels through an eyepiece, the intermediate image A1 becomes an enlarged virtual image A2 with a wider depth range, such that behind the intermediate image, a final imaging depth conforms to the scene depth. In this way, the human eyes can see a three-dimensional virtual image of a curved surface conforming to the scene.

With reference to FIG. 11, a calculation method for an angle of view $\theta$ is: $\theta=2 \arctan(R/2L)$. In the present disclosure, L can be adjusted according to requirements, and can be adjusted to be shorter to increase the angle of view.

An embodiment of the present disclosure further provides a VR device. Referring again to FIG. 11, the VR device includes: the three-dimensional display apparatus 10 as shown in FIG. 1 or 9, and an eyepiece 20 corresponding to a light exit side of a transmissive phase modulator 200 in the three-dimensional display apparatus 10.

The VR device may be a head-mounted VR device or other types of VR devices.

Figure 12:
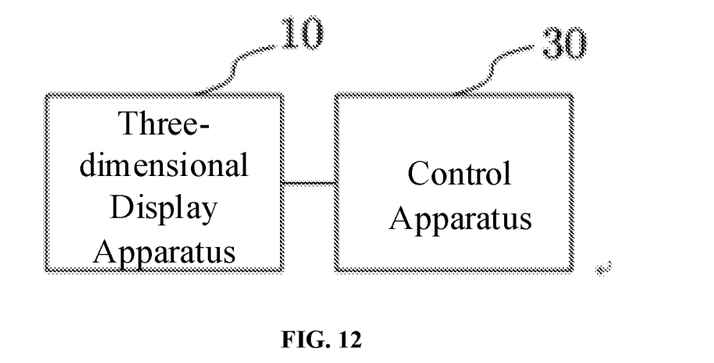
FIG. 12 is a structural block diagram of a VR device according to an embodiment of the present disclosure.

FIG. 12 is a structural block diagram of another VR device according to an embodiment of the present disclosure. Referring to FIG. 12, the VR device further includes:

a control apparatus 30, configured to acquire a 3D picture to be displayed, control a display layer 100 in the three-dimensional display apparatus 10 to display on the basis of the 3D picture to be displayed, and control each modulation unit 210 of the transmissive phase modulator 200 to perform phase modulation on light received by the modulation unit.

In this implementation, the display layer and the transmissive phase modulator are controlled to operate on the basis of the 3D picture, so as to control the VR device to display.

In an embodiment of the present disclosure, the control apparatus 300 may be a driven integrated circuit in the AR device.

Here, the 3D picture to be displayed may be a next frame of picture to be displayed, or may be next frames of pictures to be displayed.

Optionally, the control apparatus 30 is configured to identify a voltage corresponding to each modulation unit 210 of the transmissive phase modulator 200 on the basis of the 3D picture to be displayed; and control each modulation unit 210 of the transmissive phase modulator 200 to operate by adopting the voltage corresponding to the modulation unit 210.

In this implementation, the voltage of the modulation unit may be identified on the basis of the 3D picture; and each modulation unit is controlled to operate to complete the phase modulation on the basis of the voltage.

Exemplarily, in the transmissive phase modulator 200, an electrode on one side is a surface electrode, and an electrode on the other side is an electrode block. When controlling the operation of the transmissive phase modulator 200, all that is needed is to control a level of each electrode block according to the 3D picture to be displayed while a level of the surface electrode remains unchanged.

Optionally, the control apparatus 30 is configured to identify (three-dimensional) coordinates of a pixel of the 3D picture corresponding to each modulation unit 210 on the basis of the 3D picture to be displayed; and identify a voltage corresponding to each modulation unit 210 on the basis of the coordinates of the pixel of the 3D picture corresponding to each modulation unit 210.

As the modulation units of the phase modulator and the pixels of the display layer are not usually in one-to-one correspondence, and generally, one modulation unit corresponds to multiple pixels, it is necessary to first identify the three-dimensional coordinates of the multiple pixels corresponding to the modulation unit during control, and then identify the voltage on the basis of the three-dimensional coordinates of the multiple pixels, wherein a corresponding relationship between the three-dimensional coordinates and the voltage may be identified and stored in advance.

The method for identifying the voltage on the basis of the three-dimensional coordinates of the multiple pixels may be as follows: calculating an average value of the three-dimensional coordinates of the multiple pixels, and using the average value to identify the corresponding voltage; or selecting a maximum value, minimum value, or median value of the three-dimensional coordinates of the multiple pixels, and identifying the corresponding voltage and the like by using the selected three-dimensional coordinates.

In the embodiment of the present disclosure, the corresponding relationship between the modulation units and the pixels of the display layer may be identified and stored in advance. When refractive indexes of the optical path adjustment liquid crystal cell are different, the corresponding relationship between the modulation units and the pixels of the display layer may be different accordingly, such that the accuracy can be ensured to the greatest extent. When the refractive indexes of the optical path adjustment liquid crystal cell are different, the corresponding relationship between the modulation units and the pixels of the display layer may be the same. The reason is that the modulation units and the pixels are in a one-to-many correspondence and pictures displayed by pixels close to each other are similar, such that even when the refractive indexes of the optical path adjustment liquid crystal cell are different, maintaining the corresponding relationship between the modulation units and the pixels of the display layer unchanged may not affect the modulation, and the driving may be simpler.

Figure 13:
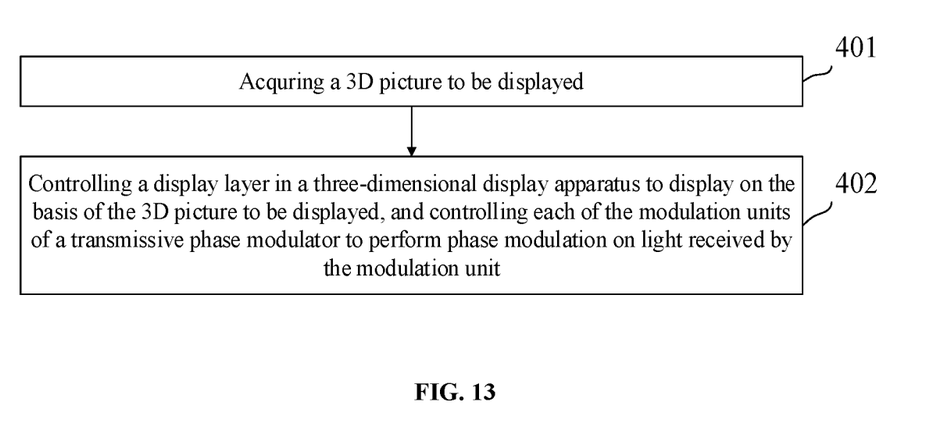
FIG. 13 is a flowchart of a three-dimensional display control method according to an embodiment of the present disclosure.

FIG. 13 is a flowchart of a three-dimensional display control method according to an embodiment of the present disclosure. Referring to FIG. 13, the method may be executed by the control apparatus. The method includes the following steps.

In step 401, a 3D picture to be displayed is acquired.

In step 402, a display layer in the three-dimensional display apparatus is controlled to display on the basis of the 3D picture to be displayed, and each of modulation units of a transmissive phase modulator is controlled to perform phase modulation on light received by the modulation unit.

In this implementation, the display layer and the transmissive phase modulator are controlled to operate on the basis of the 3D picture so as to control a VR device to display.

Optionally, controlling each modulation unit of the transmissive phase modulator to perform phase modulation on the light received by the modulation unit includes:

identifying a voltage corresponding to each modulation unit of the transmissive phase modulator on the basis of the 3D picture to be displayed; and controlling each modulation unit of the transmissive phase modulator to operate by adopting the voltage corresponding to the modulation unit.

In this implementation, the voltage of the modulation unit may be identified based on the 3D picture, and each modulation unit may be controlled to operate to complete the phase modulation on the basis of the voltage.

Optionally, identifying the voltage corresponding to each modulation unit of the transmissive phase modulator on the basis of the 3D picture to be displayed includes:

identifying (three-dimensional) coordinates of pixels of the 3D picture corresponding to each modulation unit on the basis of the 3D picture to be displayed; and identifying the voltage corresponding to each modulation unit on the basis of the coordinates of the pixels of the 3D picture corresponding to each modulation unit.

As the modulation units of the phase modulator and the pixels of the display layer are not usually in one-to-one correspondence, and generally, one modulation unit corresponds to multiple pixels, it is necessary to first identify the three-dimensional coordinates of the multiple pixels corresponding to the modulation unit during control, and then identify the voltage on the basis of the three-dimensional coordinates of the multiple pixels, wherein a corresponding relationship between the three-dimensional coordinates and the voltage may be identified and stored in advance.

A way for identifying the voltage on the basis of the three-dimensional coordinates of the multiple pixels may be as follows: calculating an average value of the three-dimensional coordinates of the multiple pixels, and using the average value to identify the corresponding voltage; or, selecting a maximum value, minimum value, or median value of the three-dimensional coordinates of the multiple pixels, and identifying the corresponding voltage and the like by using the selected three-dimensional coordinates.

In the embodiment of the present disclosure, the corresponding relationship between the modulation units and the pixels of the display layer may be identified and stored in advance. When refractive indexes of the optical path adjustment liquid crystal cell are different, the corresponding relationship between the modulation units and the pixels of the display layer may be different accordingly, such that the accuracy can be ensured to the maximum extent. When the refractive indexes of the optical path adjustment liquid crystal cell are different, the corresponding relationship between the modulation units and the pixels of the display layer may be the same. The reason is that the modulation units and the pixels are in a one-to-many correspondence and pictures displayed by pixels close to each other are similar, such that even when the refractive indexes of the optical path adjustment liquid crystal cell are different, maintaining the corresponding relationship between the modulation units and the pixels of the display layer unchanged may not affect the modulation, and the driving may be simpler.

Figure 14:
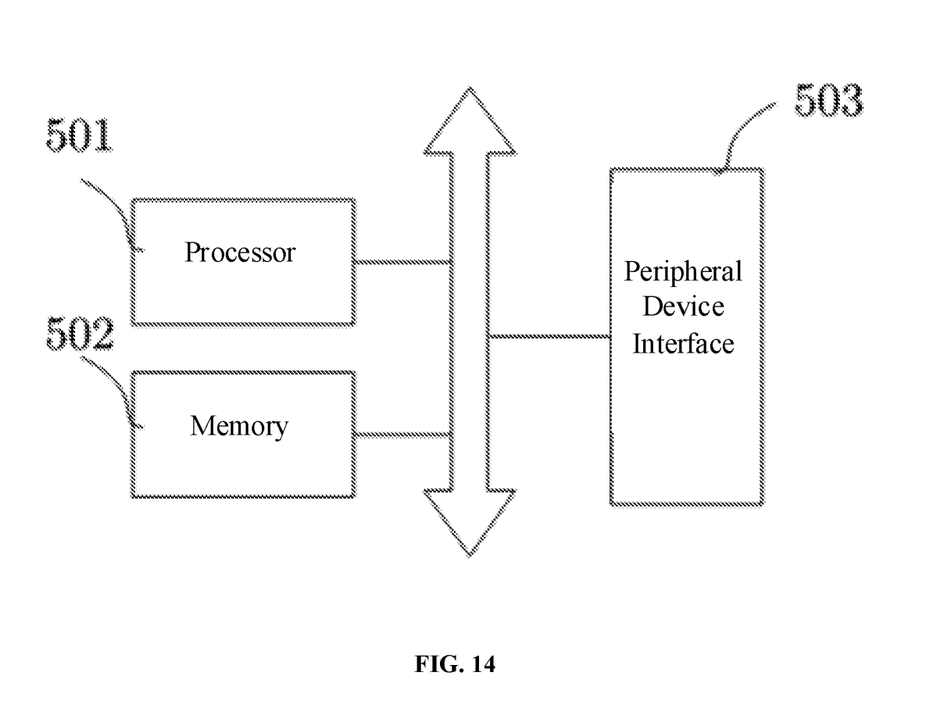
FIG. 14 is a structural block diagram of another VR device according to an embodiment of the present disclosure.

FIG. 14 is a structural block diagram of a VR device 500 according to an embodiment of the present disclosure. Generally, the device 500 includes a processor 501 and a memory 502.

The processor 501 may include one or more processing cores, such as a 4-core processor, an 8-core processor, and the like. The processor 501 may be implemented by using at least one of hardware forms in a digital signal processor (DSP), an field-programmable gate array (FPGA), and a programmable logic array (PLA). The processor 501 may further include a main processor and a coprocessor. The main processor is a processor for processing data in an awake state, and is also called as a central processing unit (CPU). The coprocessor is a low-power processor for processing data in a standby state. In some embodiments, the processor 501 may be integrated with a graphics processing unit (GPU) which is responsible for rendering and drawing of content required to be displayed by a display screen. In some embodiments, the processor 501 may further include an artificial intelligence (AI) processor for processing a calculation operation related to machine learning.

The memory 502 may include one or more computer-readable storage media which may be non-transitory. The memory 502 may further include a high-speed random access memory, as well as a non-volatile memory, such as one or more disk storage devices and flash storage devices. In some embodiments, the non-transitory computer-readable storage medium in the memory 502 is configured to store at least one instruction which is executable by the processor 501 to implement the three-dimensional display control method according to the embodiments of the present disclosure.

In some embodiments, the device 500 may optionally further include: a peripheral device interface 503 and at least one peripheral device. The processor 501, the memory 502 and the peripheral device interface 503 may be connected through a bus or a signal line. Each peripheral device may be connected to the peripheral device interface 503 by a bus, a signal line, or a circuit board.

Those skilled in the art can understand that the structure shown in FIG. 14 does not constitute a limitation on the device 500. The device 500 may include more or fewer components than those illustrated, or may combine certain components, or may adopt different arrangements of the components.

In exemplary embodiments, a non-transitory computer-readable storage medium including an instruction is further provided, such as a memory including the instruction which is executable by a processor to complete the three-dimensional display control method shown in various embodiments of the present invention. For example, the non-transitory computer-readable storage medium may be a ROM, a random access memory (RAM), a CD-ROM, a magnetic tape, a floppy disc, an optical data storage device, or the like.

Other embodiments of the present disclosure will be apparent to those skilled in the art from consideration of the specification and practice of the present disclosure. This application is intended to cover any variations, uses, or adaptations of the present disclosure following the general principles thereof and including common knowledge or commonly used technical measures which are not disclosed herein. The specification and embodiments are to be considered as exemplary only, and the true scope and spirit of the present disclosure are indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure is only limited by the appended claims.

What is claimed is:

1. A three-dimensional display apparatus, comprising:
a display layer and a transmissive phase modulator; wherein
the transmissive phase modulator is disposed on a light exit side of the display layer; and
the transmissive phase modulator comprises a plurality of modulation units, and the transmissive phase modulator comprises two first electrode layers opposite to each other, and a first liquid crystal layer disposed between the two first electrode layers;
wherein at least one of the two first electrode layers of the transmissive phase modulator comprises a plurality of electrode blocks distributed in an array, each of the electrode blocks corresponding to a modulation unit.

2. The three-dimensional display apparatus according to claim 1, wherein the transmissive phase modulator further comprises first alignment films disposed on both sides of the first liquid crystal layer respectively, and directions of initial long axes of liquid crystal molecules in the first liquid crystal layer are the same.

3. The three-dimensional display apparatus according to claim 1, further comprising an optical path adjustment liquid crystal cell disposed between the display layer and the transmissive phase modulator; wherein
the optical path adjustment liquid crystal cell comprises two second electrode layers opposite to each other, and a second liquid crystal layer disposed between the two second electrode layers; and
the optical path adjustment liquid crystal cell further comprises second alignment films disposed on both sides of the second liquid crystal layer respectively, and directions of initial long axes of liquid crystal molecules in the second liquid crystal layer are the same.

4. The three-dimensional display apparatus according to claim 1, wherein the display layer is an OLED display layer; and the three-dimensional display apparatus further comprises: a linear polarizer disposed on the light exit side of the display layer, and a polarization direction of light emitted from the OLED display layer after passing through the linear polarizer is the same as the initial long axis direction of the liquid crystal molecules in the transmissive phase modulator.

5. The three-dimensional display apparatus according to claim 1, wherein the display layer is an LCD display layer; and the LCD display layer comprises a display substrate, and a linear polarizer disposed on a light exit side of the display substrate, and a polarization direction of light emitted from the LCD display layer is the same as the initial long axis direction of the liquid crystal molecules in the transmissive phase modulator.

6. The three-dimensional display apparatus according to claim 1, wherein the display layer comprises a plurality of pixels, and each of the modulation units corresponds to a fixed number of pixels in the plurality of pixels.

7. The three-dimensional display apparatus according to claim 2, wherein at least one of the two first electrode layers of the transmissive phase modulator comprises a plurality of electrode blocks distributed in an array, each of the electrode blocks corresponding to a modulation unit.

8. A virtual reality device, comprising:
a three-dimensional display apparatus, comprising: a display layer and a transmissive phase modulator; wherein the transmissive phase modulator is disposed on a light exit side of the display layer; and the transmissive phase modulator comprises a plurality of modulation units, and the transmissive phase modulator comprises two first electrode layers opposite to each other, and a first liquid crystal layer disposed between the two first electrode layers; wherein at least one of the two first electrode layers of the transmissive phase modulator comprises a plurality of electrode blocks distributed in an array, each of the electrode blocks corresponding to a modulation unit;
an eyepiece corresponding to a light exit side of a transmissive phase modulator in the three-dimensional display apparatus.

9. The virtual reality device according to claim 8, further comprising:
a control apparatus, wherein the control apparatus is connected with the three-dimensional display apparatus.

10. The virtual reality device according to claim 8, wherein the transmissive phase modulator further comprises first alignment films disposed on both sides of the first liquid crystal layer respectively, and directions of initial long axes of liquid crystal molecules in the first liquid crystal layer are the same.

11. The virtual reality device according to claim 8, wherein the three-dimensional display apparatus further comprises an optical path adjustment liquid crystal cell disposed between the display layer and the transmissive phase modulator; wherein the optical path adjustment liquid crystal cell comprises two second electrode layers opposite to each other, and a second liquid crystal layer disposed between the two second electrode layers; and the optical path adjustment liquid crystal cell further comprises second alignment films disposed on both sides of the second liquid crystal layer respectively, and directions of initial long axes of liquid crystal molecules in the second liquid crystal layer are the same.

12. The virtual reality device according to claim 8, wherein the display layer is an OLED display layer; and the three-dimensional display apparatus further comprises: a linear polarizer disposed on the light exit side of the display layer, and a polarization direction of light emitted from the OLED display layer after passing through the linear polarizer is the same as the initial long axis direction of the liquid crystal molecules in the transmissive phase modulator.

13. The virtual reality device according to claim 8, wherein the display layer is an LCD display layer; and the LCD display layer comprises a display substrate, and a linear polarizer disposed on a light exit side of the display substrate, and a polarization direction of light emitted from the LCD display layer is the same as the initial long axis direction of the liquid crystal molecules in the transmissive phase modulator.

14. The virtual reality device according to claim 8, wherein the display layer comprises a plurality of pixels, and each of the modulation units corresponds to a fixed number of pixels in the plurality of pixels.

\* \* \* \* \*